(12) United States Patent
Chokshi et al.

(10) Patent No.: US 6,413,356 B1
(45) Date of Patent: Jul. 2, 2002

(54) SUBSTRATE LOADER FOR A SEMICONDUCTOR PROCESSING SYSTEM

(75) Inventors: Himanshu J. Chokshi, Fremont; Ben Ju, Milpitas; Eric J. Hilton, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/562,252

(22) Filed: May 2, 2000

(51) Int. Cl.$^7$ .................................................. C23F 1/02
(52) U.S. Cl. ...................... 156/345; 451/339; 451/331; 414/939; 414/937; 414/940
(58) Field of Search ................................ 414/939, 937, 414/940; 156/345; 451/339, 331

(56) References Cited

U.S. PATENT DOCUMENTS 5,226,758 A * 7/1993 Tanaka et al. .............. 414/939
5,570,987 A * 11/1996 McKenna .................... 414/939
6,042,324 A * 3/2000 Aggarwal et al. ........... 414/937
6,071,059 A * 6/2000 Mages et al. ................ 156/345
6,086,323 A * 7/2000 Rush et al. .................. 414/940

* cited by examiner

*Primary Examiner*—Joseph J. Hail, III
*Assistant Examiner*—Lee Wilson
(74) *Attorney, Agent, or Firm*—Moser, Patterson & Sheridan

(57) ABSTRACT

A substrate loader for a semiconductor substrate processing system that generally includes a wall having an exterior side with one or more apertures formed therethrough and a related method of loading a processing system. A door assembly is movably coupled to the wall in each of the apertures and is adapted to temporarily retain the substrate. A first portion of the door assembly substantially closes the aperture when the door assembly is in a first or closed position, and a second portion of the door assembly substantially closes the aperture when the door assembly is in a second or open position. A robot for transferring a substrate in a processing system is also provided.

20 Claims, 10 Drawing Sheets

SUBSTRATE LOADER FOR A SEMICONDUCTOR PROCESSING SYSTEM

BACKGROUND OF THE DISCLOSURE

1. Field of Invention

The present invention relates generally to a processing system and method for polishing a substrate, and specifically, to an apparatus and method for loading the processing system.

2. Background of Invention

In semiconductor wafer processing, the use of chemical mechanical planarization, or CMP, has gained favor due to the enhanced ability to increase device density on a semiconductor workpiece, or substrate, such as a wafer. As the demand for planarization of layers formed on wafers in semiconductor fabrication increases, the requirement for greater system (i.e., process tool) throughput with less wafer damage and enhanced wafer planarization has also increased.

Two exemplary CMP systems that address these issues are described in U.S. Pat. No. 5,804,507, issued Sep. 8, 1998 to Perlov et al. and in U.S. Pat. No. 5,738,574, issued Apr. 15, 1998 to Tolles et al, both of which are hereby incorporated by reference. Perlov et al. and Tolles et al. disclose a CMP system having a planarization system that is supplied wafers from cassettes located in an adjacent liquid filled bath. A transfer mechanism, or robot, facilitates the transfer of the wafers from the bath to a transfer station. The transfer station generally contains a load cup that positions wafers into one of four processing heads mounted to a carousel. The carousel moves each processing head sequentially over the load cup to receive a wafer. As the processing heads are loaded, the carousel moves the processing heads and wafers through the planarization stations for polishing. The wafers are planarized by moving the wafer relative to a polishing pad in the presence of a slurry or other polishing fluid medium. The polishing pad may include an abrasive surface. The slurry typically contains both chemicals and abrasives that aid in the removal of material from the wafer. After completion of the planarization process, the wafer is returned back through the transfer station to the proper cassette located in the bath.

Generally, the wafer cassettes remain in the bath during operation of the system. As the wafers are polished, the system eventually requires that the cassettes containing polished wafers be removed from the bath to create space for new cassettes containing unpolished wafers. During the process of loading the bath, the system is shut down to prevent accidental interaction between operators exchanging cassettes in the bath and robotic equipment used to retrieve wafers from the bath. During this period, no wafers are processed resulting in the loss of valuable production time and factory capacity (i.e., adversely affecting substrate throughput).

Therefore, there is a need in the art for an apparatus that loads substrates in a chemical mechanical polishing system having minimal impact on substrate throughput.

SUMMARY OF INVENTION

One aspect of the present invention generally provides an apparatus for loading a semiconductor processing system. In one embodiment, a loader includes a wall having an exterior side with one or more apertures formed therethrough. A door assembly is movably coupled to the wall in each of the apertures and is adapted to temporarily retain substrates. A first portion of the door assembly substantially closes the aperture when the door assembly is in a first or closed position, and a second portion of the door assembly substantially closes the aperture when the door assembly is in a second or open position.

In another embodiment of the invention, a loader may further include a wafer mapper, an interlock, a wafer sensor and a wetting system. The loader may additionally be coupled to a factory interface and one or more polishing modules having a robot positioned therebetween. The robot transfers the wafers between the one or more polishing modules and the substrate storage cassette.

In yet another embodiment, the invention provides a robot for transferring a substrate in a processing system. The robot includes a central body having a shaft rotationally extending therefrom. An arm coupled at a proximate end to the shaft by a rotary actuator. A gripper is coupled to a distal end of the arm.

In another aspect of the invention, a method for loading a semiconductor processing system is provided. In one embodiment, a method for loading a processing system includes providing a first substrate cassette supported by a door assembly in a position where substrates contained in the first substrate cassette may be accessed by a robot that transfers the substrates to a processing area for processing; moving the door assembly supporting the first substrate cassette to a position where the first substrate cassette may not be accessed by the robot; replacing the first substrate cassette with a second substrate cassette while the system continues to process other substrates; and returning the door assembly to the position where the second substrate cassette may be accessed by the robot.

In another embodiment, the method includes providing a first substrate cassette having one or more substrates, securing the substrate with a gripper disposed at a distal end of an arm of a robot, removing the substrate from the cassette by a combined lateral movement of the robot and rotational movement of the arm about the center of the robot that produces a movement of the substrate substantially perpendicular to the lateral movement of the robot.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF INVENTION

Figure 1:
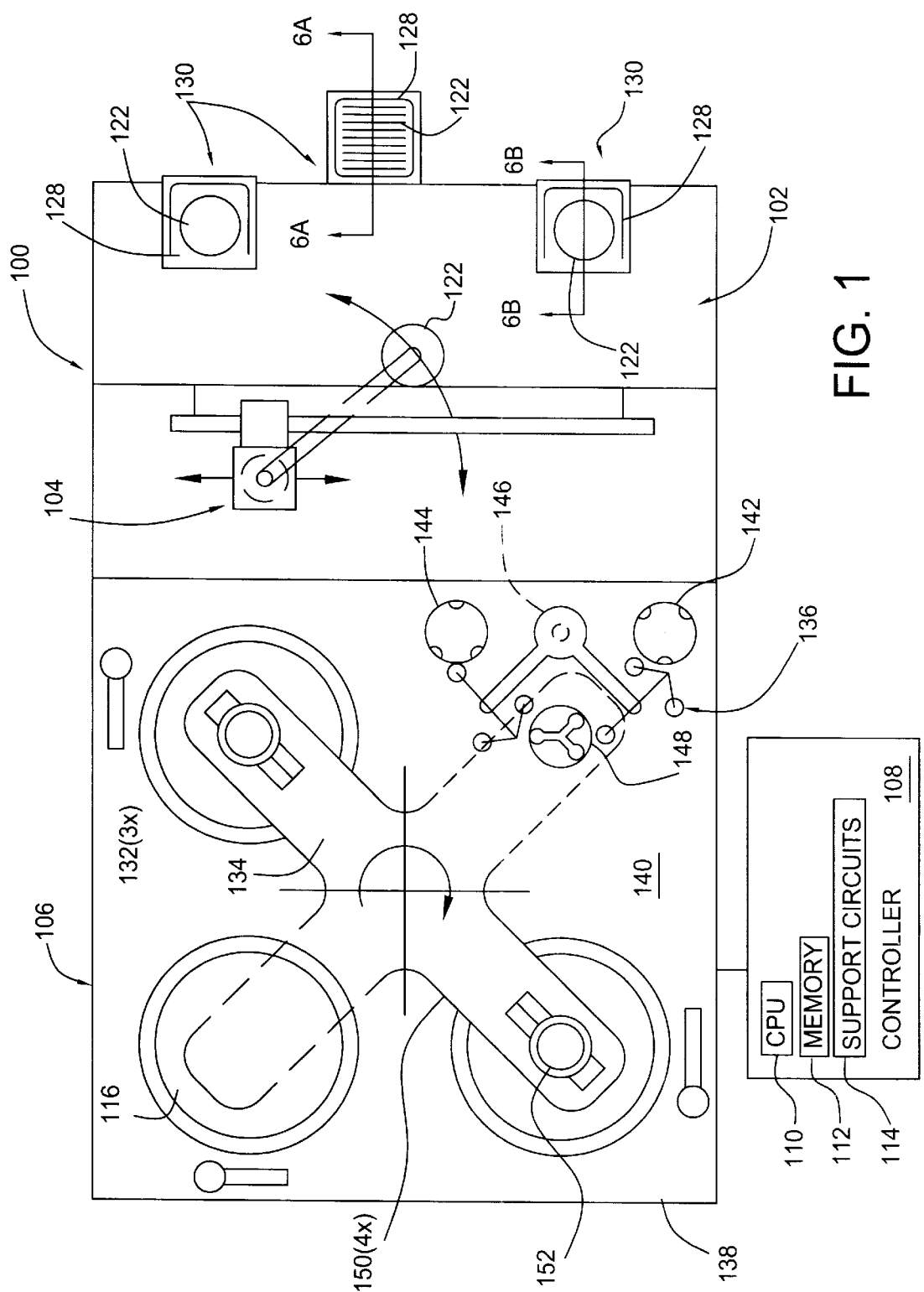
FIG. 1 is a plan view of a chemical mechanical planarization system having a substrate loader.

FIG. 1 depicts a plan view of a chemical mechanical planarization system 100. The exemplary system 100 generally comprises a factory interface 102, a loading robot 104, and a polishing module 106. Generally, the loading robot 104 is disposed proximate the factory interface 102 and the polishing module 106 to facilitate the transfer of substrates 122 therebetween.

The factory interface 102 generally includes one or more door assemblies 130 where substrate storage cassettes 128 may be loaded into, or removed from the factory interface 102. The substrate storage cassettes 128 hold substrates 122 before and after processing. Optionally, the factory interface 102 may include substrate cleaning modules, queuing stations, plating modules and metrology modules.

A controller 108 is provided to facilitate control and integration of the modules comprising the system 100. The controller 108 comprises a central processing unit (CPU) 110, a memory 112, and support circuits 114. The controller 108 is coupled to the various components of the system 100 to facilitate control of, for example, the polishing and transfer processes.

One polishing module 106 that can be used to advantage with the present invention is a MIRRA® Chemical Mechanical Polisher, manufactured by Applied Materials, Inc., located in Santa Clara, Calif. Other polishing modules 102 including those that use polishing pads, polishing webs, or a combination thereof may also be used to advantage. Other systems that benefit include systems that move a substrate relative a polishing surface in a rotational, linear or in other polishing motion.

The exemplary polishing module 106 has a transfer station 136, a plurality of polishing stations 132 and a carousel 134 disposed on an upper or first side 138 of a machine base 140. In one embodiment, the transfer station 136 comprises at least an input buffer station 142, an output buffer station 144, a transfer robot 146, and a load cup assembly 148. The loading robot 104 places the substrate 122 onto the input buffer station 142. The transfer robot 146 has two gripper assemblies, each having pneumatic gripper fingers that grab the substrate 122 by the substrate's edge. The transfer robot 146 lifts the substrate 122 from the input buffer station 142 and rotates the gripper and substrate 122 to position the substrate 122 over the load cup assembly 148, then places the substrate 122 down onto the load cup assembly 148. An example of a transfer station that may be used to advantage is described by Tobin in U.S. patent application Ser. No. 09/414,771, filed Oct. 6, 1999, and is hereby incorporated by reference.

Alternatively, the transfer station 136 may comprise a load cup assembly 148. In such a configuration, the loading robot 104 places and retrieves the substrate 122 directly from the load cup assembly 148.

The carousel 134 is generally described by Tolles in the previously incorporated U.S. Pat. No. 5,804,507. Generally, the carousel 134 is centrally disposed on the base 140. The carousel 134 typically includes a plurality of arms 150, each supporting a polishing head assembly 152. Two of the arms 150 depicted in FIG. 1 are shown in phantom such that a polishing surface 116 of one of the polishing stations 132 and the transfer station 136 may be seen. The carousel 134 is indexable such that the polishing head assemblies 152 may be moved between the polishing stations 132 and the transfer station 136.

The loading robot 104 is generally positioned proximate the factory interface 102 and the polishing module 106 such that the range of motion provided by the robot 104 facilitates transfer of the substrates 122 therebetween. The loading robot 104 may be any one of a number of robots having the range of motion that facilitates substrate transfer between the factory interface 102 and the polishing module 106.

Figure 2:
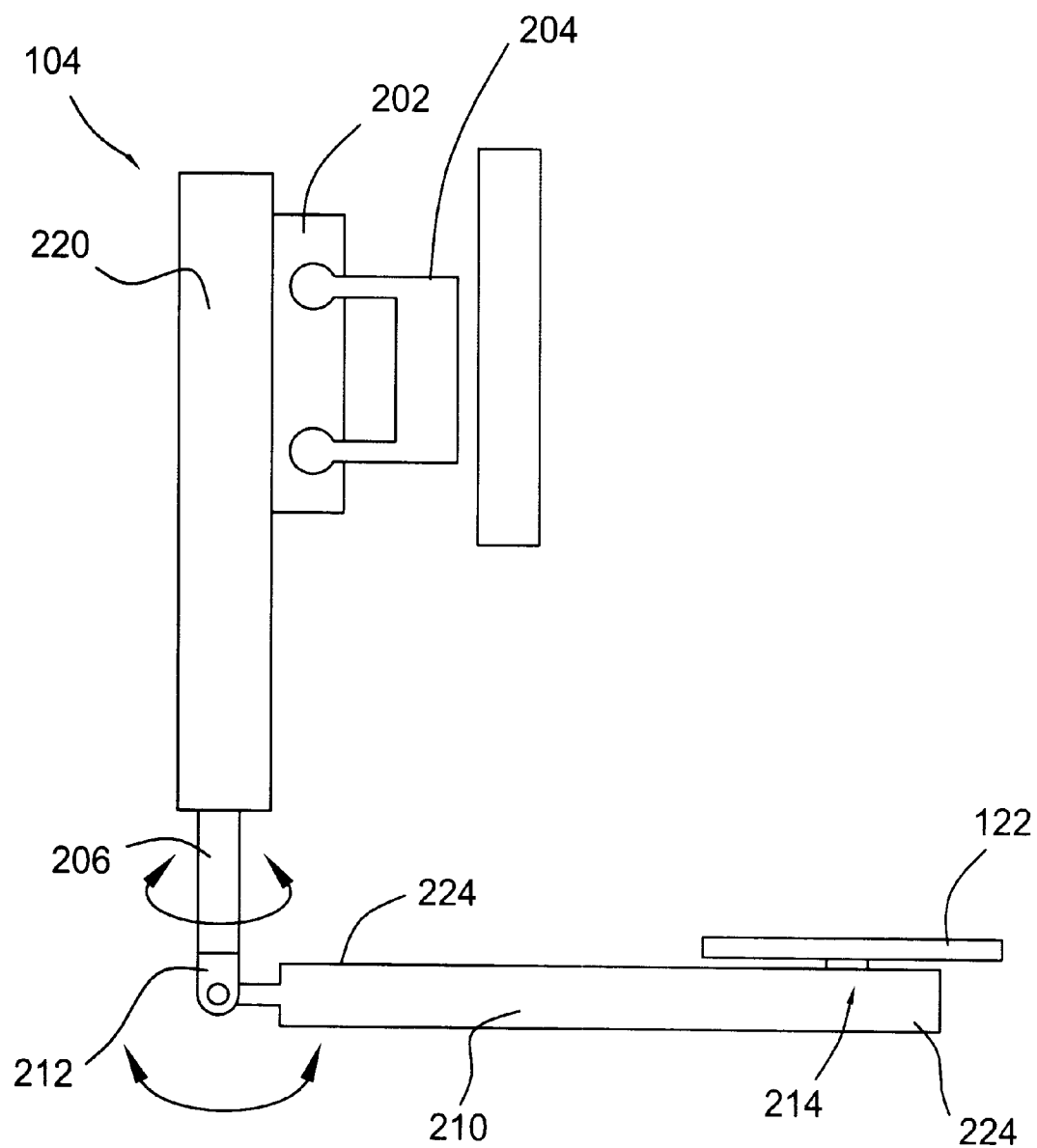
FIG. 2 depicts one embodiment of a loading robot.

FIG. 2 depicts one embodiment of the loading robot 104. The loading robot 104 is coupled to a guide 202 that is movably coupled to a rail 204 disposed in an upper portion of the factory interface 102. The rail 204 and guide 202 allow the loading robot 104 to move along the factory interface 102 or linearly (e.g., laterally) between the factory interface 102 and polishing module 106. Alternatively, the loading robot 104 may be positioned proximate the factory interface 102 and operatively coupled to a linear actuator, a pneumatic cylinder, a hydraulic cylinder, a magnetic drive, a stepper or servo motor, or other type of motion device that may position the loading robot 104 relative the factory interface 104 and polishing module 106.

The loading robot 104 generally includes a central shaft 206 extending from a central body 220. A proximate end 222 of an arm 210 is coupled to the shaft 206 by a rotary actuator 212. The rotary actuator 212 allows the arm 210 to be "flipped" 180 degrees about the actuator 212. The shaft 206 is rotatable such that the arm 210 may be rotated about the shaft 206.

A gripper 214 is disposed at a distal end 224 of the arm 210. The gripper 214 secures the substrate 122 to the arm 210 during transfer to the substrate 122 between the factory interface 102 and the polishing module 106. In one embodiment, the gripper 214 is a vacuum gripper. Optionally, other types of gripping mechanisms may be employed such as edge contact grippers, mechanical clamps, electrostatic chucks and other wafer retention devices.

Figure 3A:
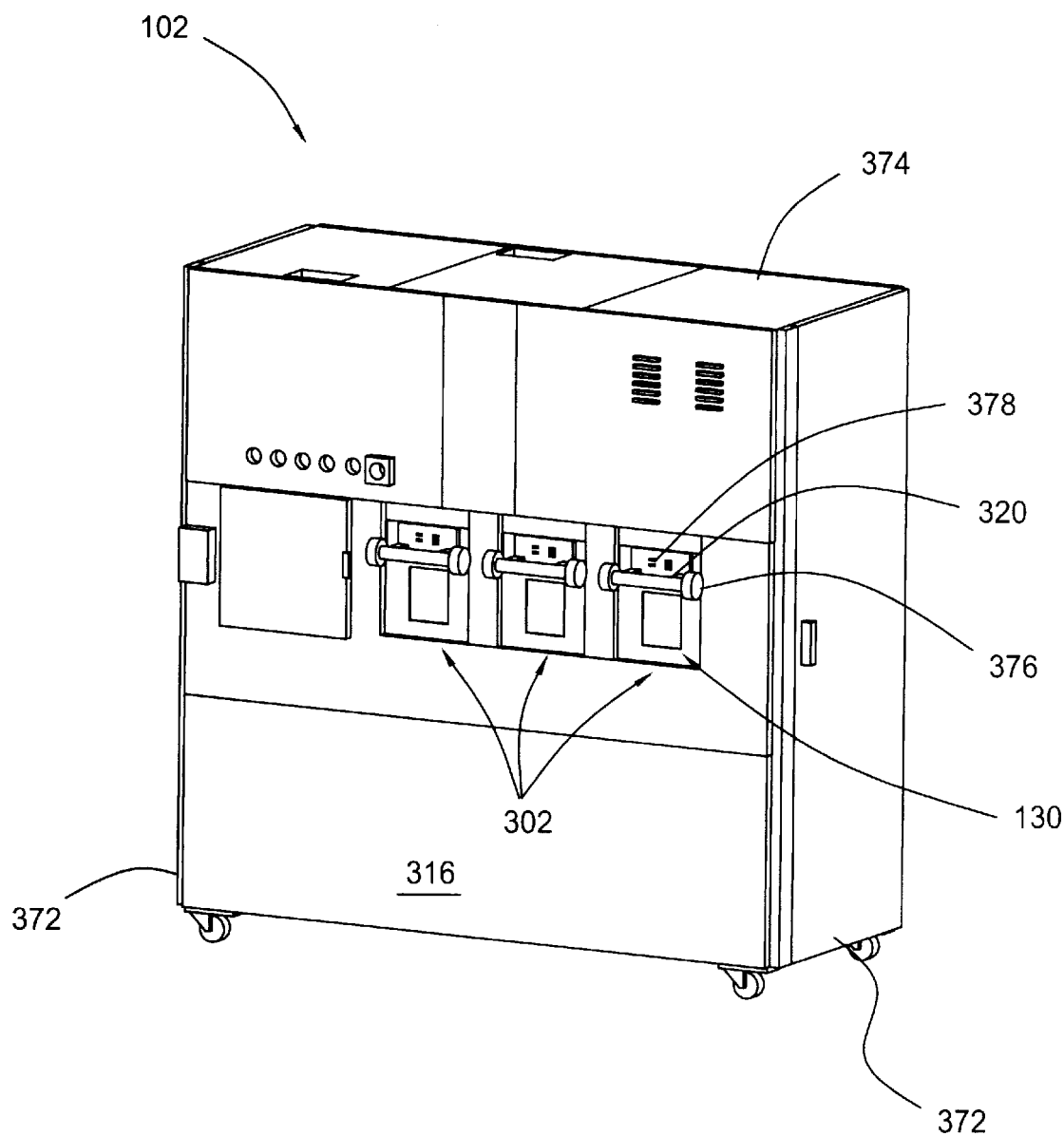
FIG. 3A depicts a perspective view of the loader of FIG. 1.
Figure 3B:
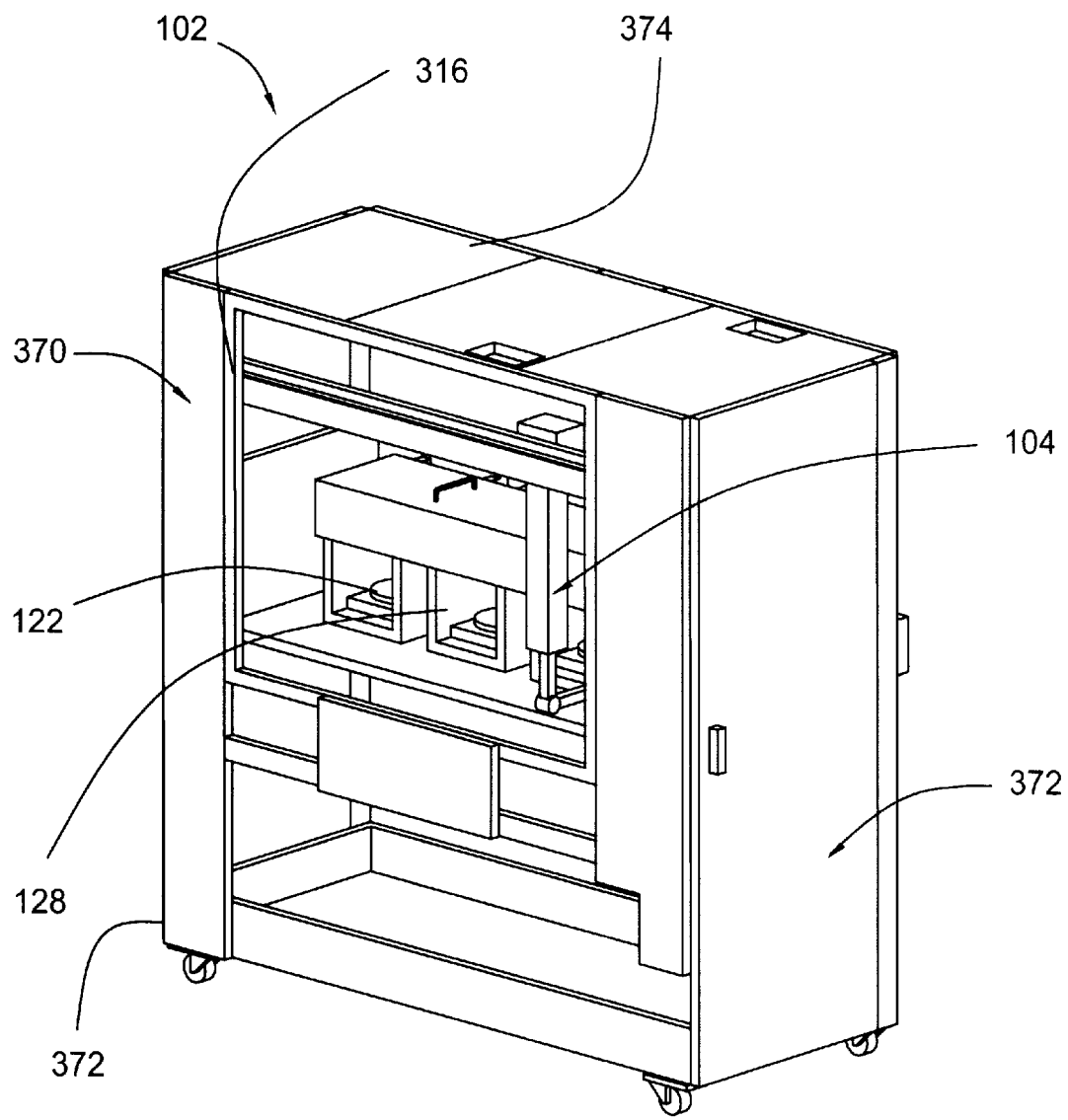
FIG. 3B depicts another perspective view of the loader of FIG. 1.

FIGS. 3A and 3B respectively depict front and back perspective views of the factory interface 102. The factory interface 102 generally includes a frame 316 enclosed by sides 372, a top 374 and an exterior side 316. A backside 370 opposite the exterior side 316 of the factory interface 102 is open to the loading robot 104. The exterior side 316 includes one or more apertures or bays 302 formed therein. Each loading bay 302 is adapted to accept the door assembly 130 that holds the substrate storage cassette 128. The substrate cassettes 128 are orientated with an open end 326 exposed towards the backside 370 of the factory interface 102 to facilitate access by the loading robot 104.

The door assembly 130 positions the substrate cassettes 129 within the factory interface 102. The door assembly 130 has a handle 320 disposed thereon to facilitate opening access to the substrate storage cassettes 128 by an operator or material handler. The handle 322 contains an interlock switch 376 coupled to the controller 108. When an operator or material handler wishes to open the door assembly 130, the switch 376 is actuated, signaling the controller 108 that the respective door assembly 130 is desired to be open. The controller 108 determines if the activity of the loading robot 104 is clear of the respective door assembly 130 (and associated cassette 128 positioned thereon) and unlocks the door assembly 130, permitting the door assembly 130 to be opened. Alternatively, the door assembly 130 may be opened and closed using automated components. A pair of indicator lights 378 is provided on the door assembly 130 or exterior side 318 of the factory interface 102 to indicate the lock/ unlocked status of the door assembly 130. In one embodiment, the factory interface 102 generally includes three door assemblies 306 disposed in a respective wafer loading bay 302.

Figure 4:
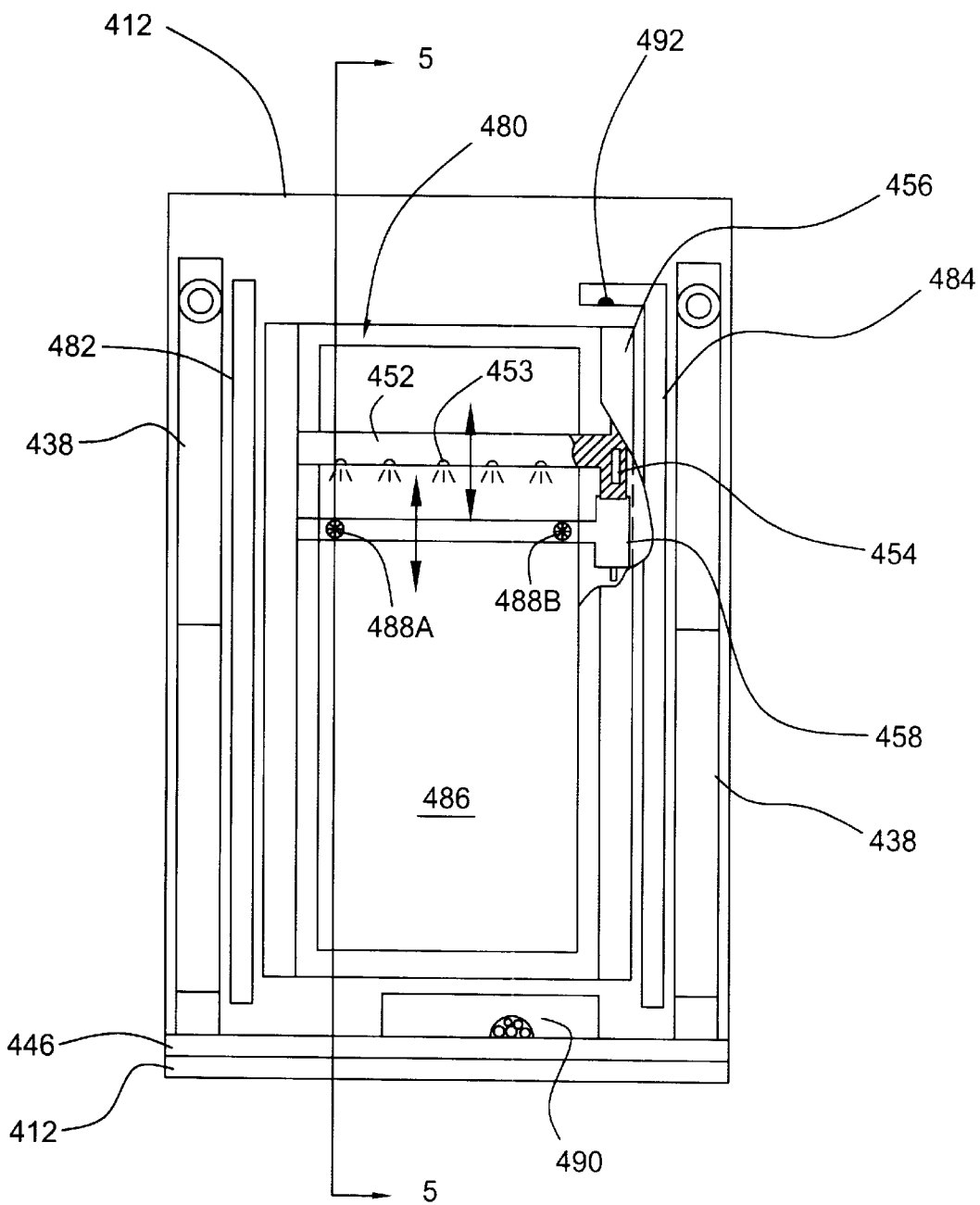
FIG. 4 is an elevation of one embodiment of a loading assembly.
Figure 5:
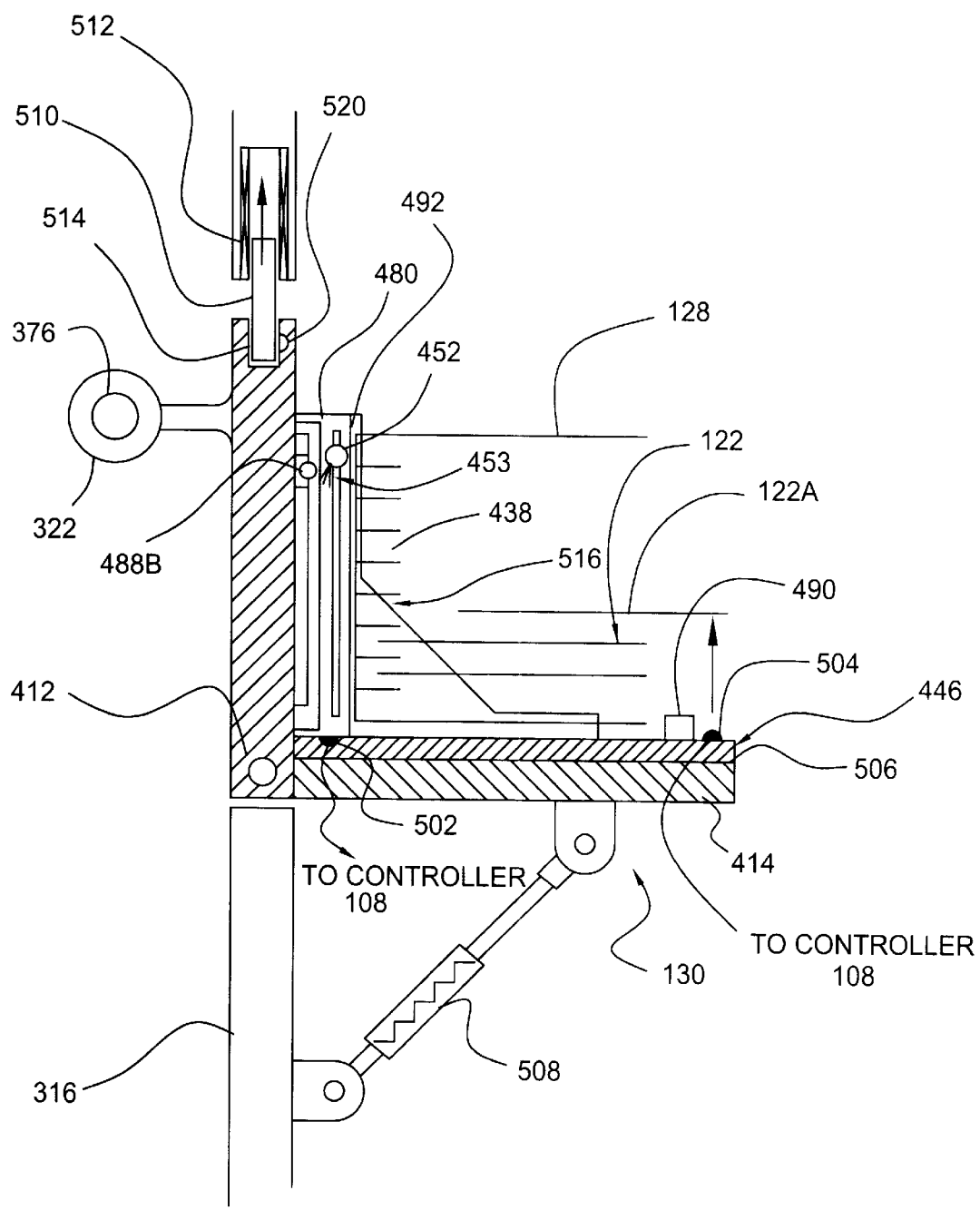
FIG. 5 is a cross sectional view of the loading assembly taken along section line 5—5 of FIG. 4.

FIGS. 4 and 5 generally depict the door assembly 130 in front and sectional views, respectively. The door assembly 130 generally includes a first portion 412 and a support plate 446 that are orientated substantially perpendicular to each other. One or more fillets 438 are disposed between the first portion 412 and the support plate 446. The fillets 438 may be disposed between the first portion 412 and the support plate 446 to enhance the structural rigidity of the door assembly 130. The door assembly 130 is rotatably coupled to the factory interface 104 by a hinge generally including shaft and bearing (not shown). A second portion 414 is coupled parallel to the support plate 446. Optionally, the second portion 414 and the support plate 446 may be combined into a single structure. The term "substantially perpendicular" is intended to mean within a few degrees of perpendicular. Of course those skilled in the arts may configure the door assembly 130 utilizing other angles by accommodating different angles by varying the configuration of other components of the system 100.

The first portion 412 generally is fabricated from aluminum or other corrosion resistant material. The first portion 412 includes a wafer mapper 480, a first locating rail 482 and a second locating rail 484. The wafer mapper 480 is fastened to the first portion 412. The wafer mapper 480 has a window 486 that shields two spaced-apart sensors 488A and 488B that are coupled to the controller 108. The sensors 488A, 488B move within the mapper 480 to detect the presence of the substrates 122 in the cassette 128 viewed through the window 486. The spaced-apart relation of the sensors 488A, 488B allow the controller 108 to additionally determine if a substrate is misaligned within the cassette 128 (i.e., the sensor 488A detects a substrate at a vertical position different that sensor 488B). The sensor 448 is coupled to the controller 108 to provide information regarding the presence of the substrate 122. The information is used to sequence substrates 122 through the polishing module 106, and to insure that substrates 122 returning from the polishing module 106 are placed in a vacant slot 516 of the cassette 128.

A blow-off bar 452 is movably mounted to the wafer mapper 480. The blow-off bar 452 includes a plurality of nozzles 453 is coupled to a gas source that provides gas (e.g., air) which is used to clear the window 486 of excess fluids or other debris. The air flowing from the nozzles 453 substantially removes on liquids or contaminants that may be present on the window 486 to enhance the operation of the sensors 488A, 488B.

The bar 452 is connected to a magnet 454 that rides in a track 456. The magnet 454 is attracted to a drive system 458 that moves the sensors 488A, 488B in the mapper 480. As such, the window 486 is continually cleared in the position required for the sensors 488A, 488B to sense the presence of the substrates 122 in the cassette 128. Alternative means may be provided such that the nozzles 453 clean the portion of the window 486 through which the sensors 488A, 488B are operating.

The rails 482, 484 and a tab 490 locate the cassette 128 in the door assembly 130 and are generally fabricated from plastic. The second rail 484 has an "L" section that contains a reflector 492 that interfaces with a sensor 502 disposed in the support plate 446. When the cassette 128 is disposed properly in the door assembly 130 (i.e., set between the rails 482, 484, the tab 490 and wafer mapper 480), the cassette 128 breaks the signal between the sensor 502 and reflector 492, indicating the presence of the cassette 128.

The support plate 446 has a sensor 504 mounted at an outer end 506 of the support plate 446. The sensor 504 directs a beam upward to detect a substrate 122A that may be undesirably extending from the cassette 128.

The second portion 414 of the door assembly 130 is generally comprises of aluminum or other corrosion resistant material. The second portion 414 has a damping device coupled thereto. The damping device facilitates controlled movement of the door assembly 130. The damping device may include springs, fluid cylinders, gas pots (gas spring), or other motion control devices. In one embodiment, the damping device is a gas pot 508 coupled between the second portion 414 and the exterior wall 316 of the factory interface 102.

An interlock pin 510 is movably disposed between the first portion 412 of the door assembly 130 and the exterior wall 316 to prevent the door assembly 130 from opening without prompting by the controller 108. In one embodiment, the interlock pin 510 is disposed in a recess 514 in the first portion 412 of the door assembly 130. Upon activation of the switch 376, the controller 108 applies power to a solenoid 512 that pulls the pin 512 clear of the recess S14 to allow the door 130 to be opened. Alternatively, the pin 510 may be disposed between other components of the door assembly 130 to prevent undesired opening. A detector 520 may be optionally disposed proximate the interlock pin 510 to provide the controller 108 with information concerning whether the door assembly 130 is locked into position. The detector 520 may be disposed in the door assembly 103, the wall 316 or be part of the solenoid 512 or the solenoid control circuitry. Optionally, other devices may be utilized to interlock the door assembly 130.

Figure 6A:
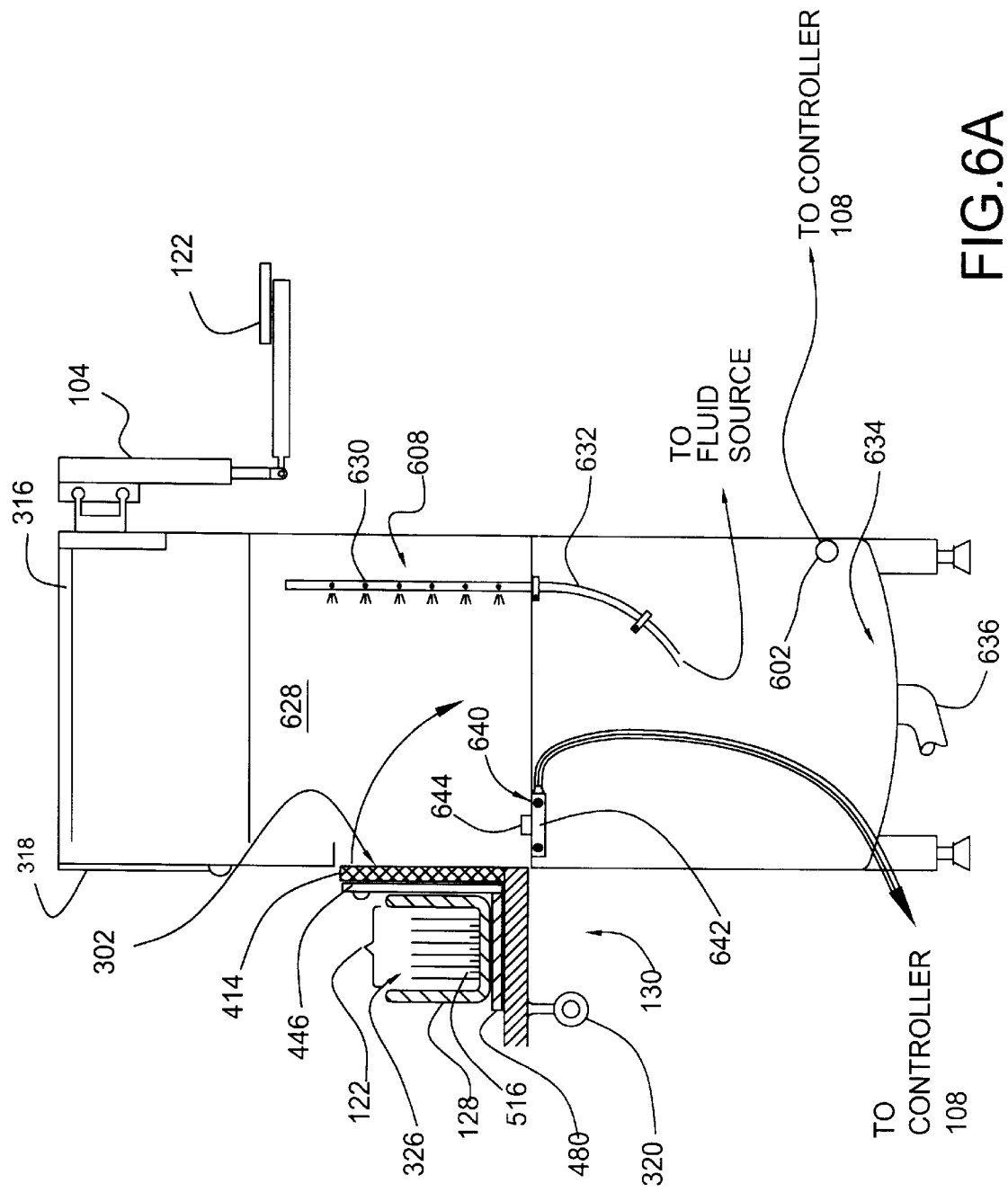
FIG. 6A depicts a cross sectional view of the factory interface taken along section line 6A—6A of FIG. 1.
Figure 6B:
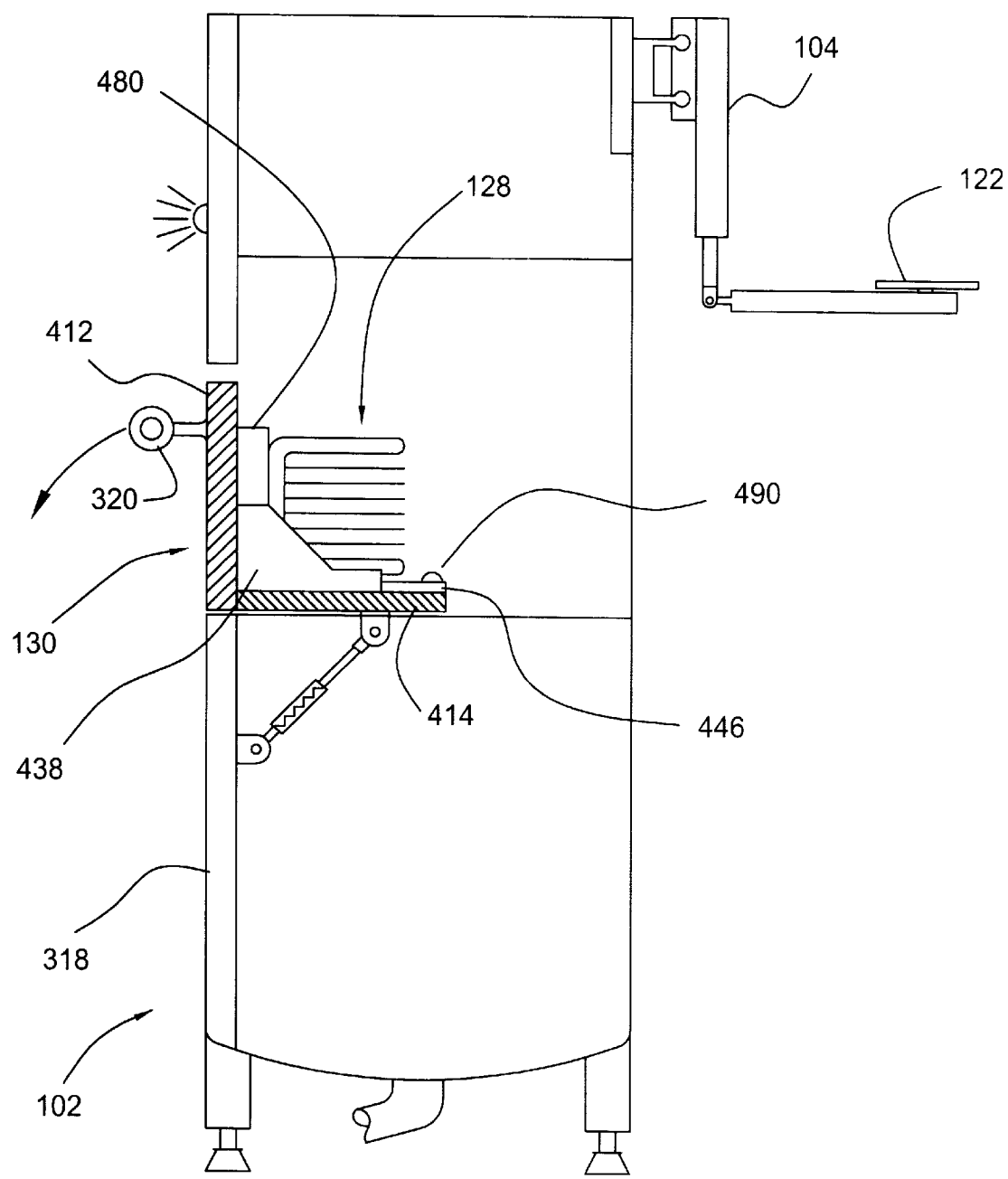
FIG. 6B depicts a cross sectional view of the factory interface taken along section line 6B—6B of FIG. 1.

FIGS. 6A and 6B depict the factory interface 102 having the door assembly 130 in a first (open) and a second (closed) position, respectively. When the door assembly 130 is in the second or closed position, the first portion 412 is substantially vertical and co-planar with the exterior wall 318 of the factory interface 104. The first portion 412 effectively blocks the bay 302, shielding the interior of the factory interface 102.

When the door assembly 130 is in the open position, the substrate storage cassette 128 having the open end 326 facing upwards, may be set upon the now horizontal first portion 412. The substrate storage cassette 128 is positioned against the second portion 414 such that the tab 490 extending from the second portion 414 retains the cassette 128 between the tab 490 and the wafer mapper 480.

While in the open position, the second portion 414 provides a barrier between the loading robot 104 and the exterior of the factory interface 104, guarding (i.e., shielding) the operator from the moving components of the system 100. As such, the system 100 may continue processing substrates 122 during material handling (i.e., substrate storage cassette change-out), thus enhancing the throughput of the system 100. When the door assembly 130 is rotated to the closed position, the open end 326 of the cassette 128 is orientated horizontally towards the loading robot 104 to facilitate access by the robot 104 to the substrates 122.

Figure 8:
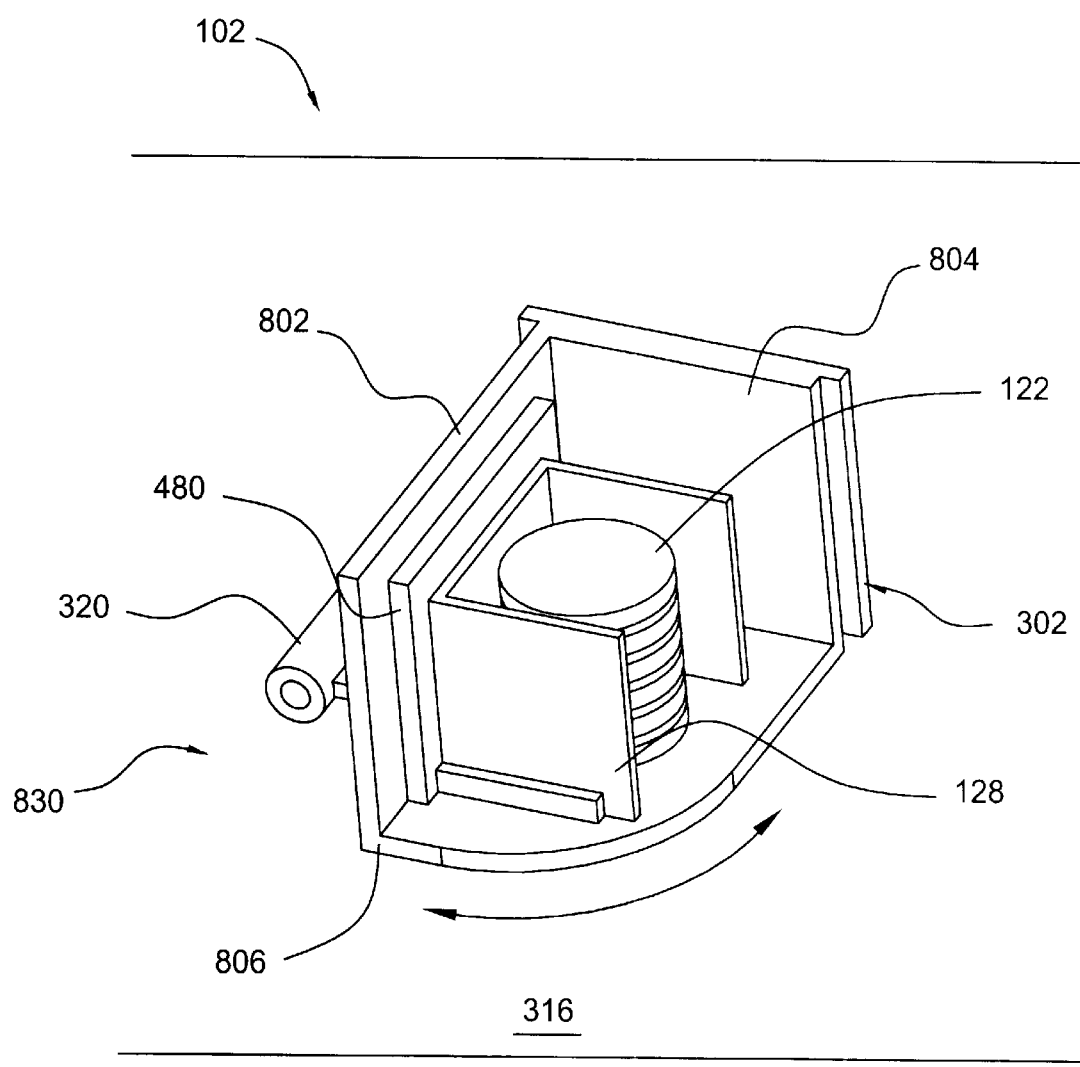
FIG. 8 depicts another embodiment of a loading assembly.

Referring to FIG. 8 which depicts an alternative embodiment of a door assembly 830, a first portion 802 and the second portion 804 are orientated vertically in the bay 302 formed in the exterior wall 316 of the factory interface 102. The door assembly 830 has a rotation about a vertical axis to move between an open and a closed position. In such a configuration, the cassette 128 containing the substrates 122 is positioned on a support plate 806 disposed between the portions 802, 804. Alternatively, one or both of the first or second portions 802, 804 may contain a catch (not shown) that supports the cassette 128 suspended therebetween.

Returning to FIG. 6A, a substrate wetting system 608 is disposed in each bay 302. Generally, the wetting system 608 includes a plurality of nozzles 630 disposed in one or more fluid supply lines 632 disposed in each bay 302. The nozzles 630 are orientated such that a wetting fluid, such as deionized water, may be sprayed on the substrates 122 contained in the substrate storage cassettes 128 to prevent the substrates (and any materials or debris thereon) from drying without immersing the substrates 122 in a fluid bath. The fluid may be sprayed from the nozzles 630 continuously or at programmable intervals. In one embodiment, the substrate wetting system 608 is coupled to an interior wall 628 of each bay 302 and maintains both sides of the substrate 122 in a wet condition. The fluids and contaminants generated by the substrate wetting system 608 are typically collected in a catch basin 634 positioned at the bottom of the factory interface 104. The catch basin 634 is coupled to a drain 636 that is typically connected to the facilities central drainage system (not shown). The catch basin 634 includes a fluid level sensor 602 that is coupled to the controller 108. If excess fluids are present in the catch basin 634, the sensor 602 indicates to the controller 108 that the fluid supply or drain systems have a malfunction and that the system 100 should be shut down. Optionally, the substrate wetting system 408 may include additional locations in each bay 302.

The factory interface 102 additionally includes a door assembly position indicator 640. The door assembly position indicator 640 includes a sensor 642 mounted to the interior wall 428 of the bay 302. The sensor 642 may be any number of sensors that can detect if the door assembly 130 is in the first (closed) position. For example, the sensor 642 may be a limit switch having a button 644 that is actuated by the second portion 414 of the door assembly 130 when the door assembly is moved into the first position. The sensor 642 is coupled to the controller 108 to provide the system 100 with information regarding whether the door assembly 130 is closed. Optionally, the controller 108 actuates an indicator light 644 disposed on the exterior of the factory interface 102 to indicate that the door assembly 130 is in the first position. Other examples of sensors 642 include proximity switches, photoelectric sensors, mechanical switches, magnetic contacts, hall effect switches and the like. Alternatively, the door assembly position indicator 640 may be mounted on the door assembly 130 or other location suitable for the type of sensor 642 selected.

Figure 7A:
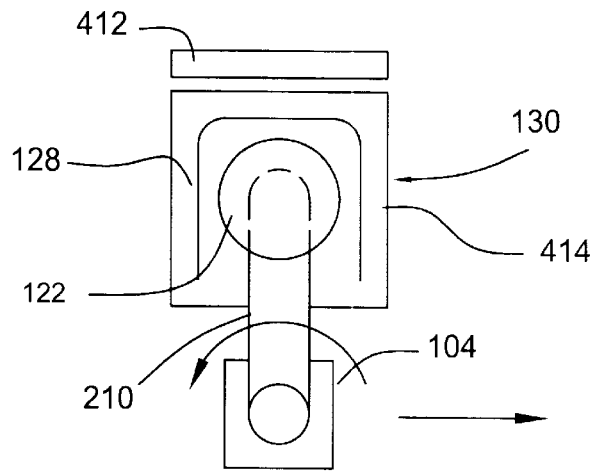
FIGS. 7A–7C depict a sequence of motion of the loading robot of FIG. 2.
Figure 7B:
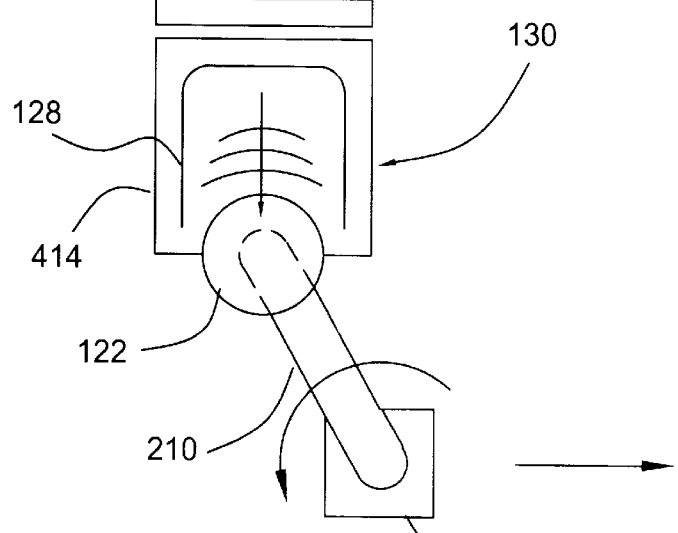
Figure 7C:
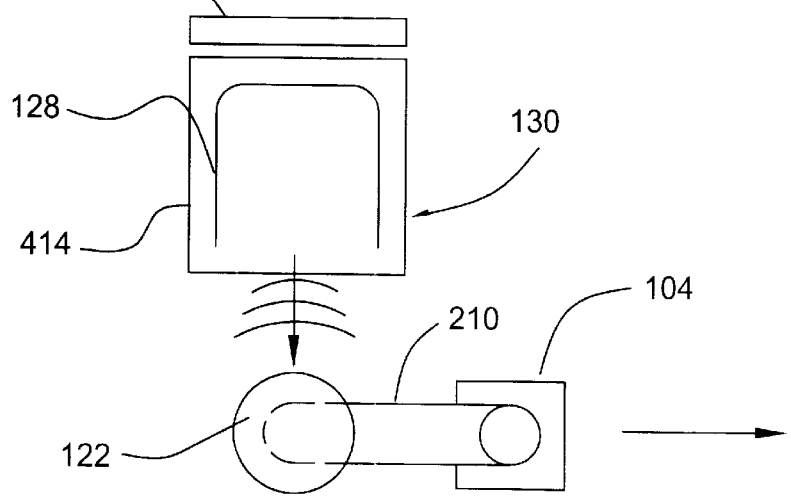

Referring to FIGS. 1, 6A and 6B, in operation, the substrate 122 is retrieved from one of the cassettes 128 by the loading robot 104. Since the arm 210 and gripper 214 remain fixed relative to each other, the gripper 215 must be directed into the cassette 128 the loading robot 104 by rotating the shaft 206 while translating the robot 104 along the rail 204. The loading robot 104 transfers the substrate 122 to the transfer station 136 where the substrate 122 is loaded into one of the polishing head assemblies 156. Before placing the substrate on the transfer station 136, the loading robot 104 flips the substrate 122 from a horizontal, feature side-up orientation in the cassette 128 to a horizontal, feature side-down orientation in the transfer station 136 by actuating the rotary actuator 212 (see FIGS. 7A–7C).

The carousel 134 is indexed to position the polishing head assembly 152 and the substrate 122 over one of the polishing stations 132. A drive system is actuated to place the substrate 122 in contact with the polishing surface 116. In one embodiment, both the polishing head assembly 152 and the polishing surface 116 rotate, while the polishing head assembly 152 is oscillated along the arm 150 of the carousel 134, thus providing the polishing motion of the substrate 122 relative the polishing surface 116.

Once polishing is completed, the substrate 122 is removed from the polishing surface 116 and indexed to another polishing station or returned to the transfer station 136. Polished substrates 122 are retrieved from the transfer station 136 by the loading robot 104 and transferred to the factory interface module 102 where the substrate 122 is flipped feature side-up and ultimately returned to one of the storage cassettes 128 where the substrates 122 are maintained in a wet conduction by the wetting system 608.

Once the one of the substrate storage cassettes 128 has been emptied of unpolished substrates 122 and filled with polished substrates 122 returning from the polishing module 106, the wafer mapper 480, through the controller 108, indicates that the cassette 128 is filled and is ready for change-out.

The switch 376 is activated to open the door assembly 130. After the controller 108 determines that if the door assembly 130 can be opened without risk of equipment or product damage, the interlock is released, removing the pin 510 that locks the door assembly 130 in the closed position. The door assembly 130 is then rotated from the first, closed position to the second open position, exposing the substrate storage cassette 128 containing the polished substrates 122 to the exterior 316 of the factory interface 102. AS the second portion 414 of the door assembly 130 shields the transfer robot 104 and other moving components of the system 100 from operators and material handlers on the exterior 318 of the factory interface 102, the system 100 may continue processing other substrates 122 while the door assembly 130 is in the open position. The ability of the system 100 to maintain operation during storage cassette exchange enhances the throughput of the system 100.

The substrate storage cassette 128 is removed from the open door assembly 130 and replaced with another cassette 128 containing substrates 122 to be processed. The substrate storage cassette 128 containing the substrates 122 to be polished are placed in the door assembly 130 and located by the rails 482, 484 and tab 490. The sensor 502 confirms that the cassette 128 is properly positioned. The door assembly 130 is then closed (i.e, returned to the closed position) wherein the interlock is re-engaged. The sensor 442 indicates that the door assembly 130 is in fully closed and that the substrates 122 are ready for processing. The wafer mapper 480 updates the controller 108 regarding the status of the substrates 122 in the cassette 128. The loading robot 104 than accesses the substrates 122 for processing as described above.

Although the teachings of the present invention that have been shown and described in detail herein, those skilled in the art can readily devise other varied embodiments that still incorporate the teachings and do not depart from the spirit of the invention.

What is claimed is:

1. A loader for exchanging substrates in a processing system comprising:
 a wall having an exterior side having one or more apertures formed therethrough;
 a door assembly movably coupled to the wall in each of the apertures, the door assembly adapted to temporarily retain the substrate;

a first portion of the door assembly substantially closing the aperture when the door assembly is in a first position; and a second portion of the door assembly substantially closing the aperture when the door assembly is in a second position.

2. The loader of claim 1, wherein the first portion further comprises a wafer mapper having spaced apart sensors.

3. The loader of claim 1, wherein the first portion and the second portion are substantially perpendicular.

4. The loader of claim 1 further comprising:

a substrate wetting system for maintaining the substrate in a wet condition.

5. The loader of claim 4, wherein the substrate wetting system further comprises:

a plurality of nozzles disposed adjacent the door assembly.

6. The loader of claim 1 further comprising a sensor that provides a signal indicative of the first portion of the door assembly being disposed in the aperture.

7. The loader of claim 1, wherein the door assembly supports a wafer storage cassette containing multiple substrates.

8. The loader of claim 7 further comprising a substrate detection system including at least one sensor that provides a signal indicative of the cassette being disposed in the door assembly.

9. The loader of claim 8 further comprising a wafer mapper disposed on the first portion, the mapper having a plurality of sensors that provides signals indicative of the presence of individual substrates within the wafer storage cassette.

10. A loader for exchanging substrates in a processing system comprising:

an exterior wall having one or more apertures formed therethrough;

a loading robot coupled to a rail disposed substantially parallel to the wall; and a door assembly movably coupled to the wall in each of the apertures and adapted to temporarily retain the substrate, the door assembly having a first portion and a second portion, the second portion disposed in the aperture when the door assembly is in a open position.

11. The loader of claim 10, wherein the loading robot further comprises:

a central body a shaft rotationally extending from the body;

rotary actuator coupled to the shaft;

an arm coupled at a proximate end to the shaft by the rotary actuator; and a gripper coupled to a distal end of the arm.

12. The loader of claim 10, wherein the second portion further comprises a locating tab.

13. The loader of claim 10, wherein the first portion and the second portion are substantially perpendicular.

14. The loader of claim 10 further comprising:

a substrate wetting system for maintaining the substrate in a wet condition.

15. The loader of claim 14, wherein the substrate wetting system further comprises:

a plurality of nozzles disposed adjacent the door assembly.

16. The loader of claim 10 further comprising a sensor that provides a signal indicative of the first portion of the door assembly being disposed in the aperture.

17. The loader of claim 10 further comprising a substrate detection system including at least one sensor that provides a signal indicative of the substrate being disposed in the door assembly.

18. The loader of claim 10, wherein the door assembly supports a wafer storage cassette containing multiple substrates.

19. The loader of claim 18 further comprising a wafer mapper disposed on the first portion, the mapper having a plurality of sensors that provides signals indicative of the presence of individual substrates within the wafer storage cassette.

20. The loader of claim 10, wherein the processing system is a chemical mechanical polisher.

* * * * *

UNITED STATES PATENT AND TRADEMARK OFFICE
CERTIFICATE OF CORRECTION

PATENT NO. : 6,413,356 B1
DATED : July 2, 2002
INVENTOR(S) : Himanshu J. Chokshi et al.

It is certified that error appears in the above-identified patent and that said Letters Patent is hereby corrected as shown below:

Column 3,
Line 35, please change "motion" to -- motions --.

Column 4,
Line 48, please change "orientated" to -- oriented --.
Line 52, please change "129 within" to -- 128 within --.
Line 67, please change "lock/" to -- locked/ --.

Column 5,
Line 8, please change "orientated" to -- oriented --.
Line 50, please change "removes on" to -- removes any --.

Column 6,
Line 9, please change "comprises" to -- comprised --.
Line 27, please change "S14" to -- 514 --.
Line 61, please change "orientated" to -- oriented --.

Column 7,
Line 11, please change "orientated" to -- oriented --.
Line 46, please change "proximaty" to -- proximity --.
Line 55, please add -- by -- before "the loading robot".

Column 8,
Line 7, please add -- to -- before "the polishing".
Line 17, please delete "the" after "Once".
Line 31, please change "AS" to -- As --.
Line 49, please delete "in" before "fully".
Line 53, please change "than accesses" to -- then accesses --.
Line 55, please delete "that" after "invention".

Signed and Sealed this

Fourteenth Day of January, 2003

JAMES E. ROGAN
*Director of the United States Patent and Trademark Office*